(12) United States Patent
Spehlmann

(10) Patent No.: US 7,786,718 B2
(45) Date of Patent: Aug. 31, 2010

(54) TIME MEASUREMENT OF PERIODIC SIGNALS

(75) Inventor: Marc Spehlmann, North Reading, MA (US)

(73) Assignee: Teradyne, Inc., North Reading, MA (US)

( * ) Notice: Subject to any disclaimer, the term of this patent is extended or adjusted under 35 U.S.C. 154(b) by 248 days.

(21) Appl. No.: 12/055,785

(22) Filed: Mar. 26, 2008

(65) Prior Publication Data

US 2009/0167381 A1 Jul. 2, 2009

Related U.S. Application Data

(60) Provisional application No. 61/018,207, filed on Dec. 31, 2007.

(51) Int. Cl.
*G01R 25/00* (2006.01)
(52) U.S. Cl. ............... 324/76.19; 324/76.39; 324/76.82
(58) Field of Classification Search .............. 324/76.29, 324/76.19, 76.39, 76.82
See application file for complete search history.

(56) References Cited

U.S. PATENT DOCUMENTS

| 4,090,141 | A | * | 5/1978 | Leblanc | .......................... | 327/3 |
|---|---|---|---|---|---|---|
| 4,613,951 | A | * | 9/1986 | Chu | ........................... | 702/176 |
| 5,604,751 | A | | 2/1997 | Panis | | |
| 5,854,797 | A | | 12/1998 | Schwartz et al. | | |
| 6,073,259 | A | | 6/2000 | Sartschev et al. | | |
| 6,469,493 | B1 | | 10/2002 | Muething, Jr. et al. | | |
| 6,609,077 | B1 | | 8/2003 | Brown et al. | | |
| 6,868,047 | B2 | | 3/2005 | Sartschev et al. | | |
| 7,085,668 | B2 | | 8/2006 | Johnson | | |
| 7,337,377 | B2 | | 2/2008 | Panis et al. | | |
| 7,379,395 | B2 | | 5/2008 | Gage et al. | | |
| 7,480,581 | B2 | | 1/2009 | Lew et al. | | |

* cited by examiner

*Primary Examiner*—Vincent Q Nguyen
(74) *Attorney, Agent, or Firm*—Wolf, Greenfield & Sacks, P.C.

(57) ABSTRACT

A system for measuring the time interval of a signal. The second signal has a frequency higher than a frequency of the first signal. According to one embodiment, the system includes an electronic circuit for determining an approximation of the time based on a period of the second signal and for determining an adjustment to the approximation based on the second signal and a third signal corresponding to the second signal and aligned with the first signal. The length of the adjustment is less than the period of the second signal.

20 Claims, 4 Drawing Sheets

TIME MEASUREMENT OF PERIODIC SIGNALS

CROSS-REFERENCE TO RELATED PATENT APPLICATIONS

This application claims priority from U.S. Provisional Application No. 61/018,207, filed on Dec. 31, 2007, which is incorporated herein by reference in its entirety.

FIELD OF THE INVENTION

The present invention relates generally to time measurement of periodic signals.

BACKGROUND

Automatic test equipment (ATE) refers to an automated, usually computer-driven, system for testing devices, such as semiconductors, electronic circuits, and printed circuit board assemblies. A device tested by ATE is referred to as a device under test (DUT).

ATE typically includes a computer system and a testing device or a single device having corresponding functionality. Pin electronics are typically part of the testing device. Pin electronics can include drivers, comparators and/or active load functionality for testing a DUT. The drivers provide test signals to pins on the testing device. The pins of the testing device may also sense signals provided by the DUT.

ATE may also perform time measurements, for example, of signals sensed during testing of the DUT. For one example, a time interval between edge transitions of two signals may be measured. In some situations, such measurements may be required to be highly accurate and/or to have a high degree of resolution. For example, testing a DUT using a tester or ATE operating at a high clock rate (e.g., 2 GHz) may call for taking time measurements that have a resolution finer than the period of the clock itself.

SUMMARY OF THE DISCLOSURE

Various embodiments of the present invention are directed to providing time measurements with high accuracy and a high degree of measurement resolution. Such time measurements may have a resolution finer than the clock rate of a tester or automated test equipment (ATE). An example of a time measurement concerns the trace of a signal as it transitions from a first level (or amplitude) to a second level. Other embodiments may be used for measuring or determining time intervals between signals for purposes (or in environments or contexts) other than testing, including, but not limited to, general measurement of signals, such as for time domain reflectometry (TDR).

One embodiment of the invention is directed to a system for detecting a time between a first periodic signal and a second periodic signal having a frequency higher than a frequency of the first signal. The system includes an electronic circuit for determining an approximation of the time based on a period of the second signal and for determining an adjustment to the approximation based on the second signal and a third signal corresponding to the second signal and aligned with the first signal. The length of the adjustment is less than the period of the second signal.

Another embodiment of the invention is directed to a method for detecting a time between a first periodic signal and a second periodic signal having a frequency higher than a frequency of the first signal. The method includes: determining an approximation of the time based on a period of the second signal; and determining an adjustment for the approximation based on the second signal and a third signal corresponding to the second signal and aligned with the first signal. The length of the adjustment is less than the period of the second signal.

BRIEF DESCRIPTION OF THE DRAWINGS

Like reference numerals in different figures indicate like elements.

DETAILED DESCRIPTION OF THE PREFERRED EMBODIMENTS

Electronic components, such as computing components (including, but not limited to, CPUs) operate in accordance with one or more system clocks. The testing (including, but not limited to, verification testing) of such components may call for measuring lengths of time intervals at a resolution finer than the period of any of the clocks. As such, deriving such measurements using simply the clocks themselves (e.g., by measuring a time interval of interest simply in terms of multiples of clock periods) may not provide measurements of a suitably fine resolution.

In embodiments of the present invention, a time measurement system includes an integrator (or a similar analog time measurement device) for measuring lengths of time intervals at a suitably fine resolution. The system receives: an input signal (including, but not limited to, a periodic signal) having an edge transition (a rising edge or a falling edge); and another signal (including, but not limited to, a clock signal) having a frequency higher than that of the input signal. The timing of the edge transition relative to a reference time (or reset time) is determined by the integrator.

Figure 4:
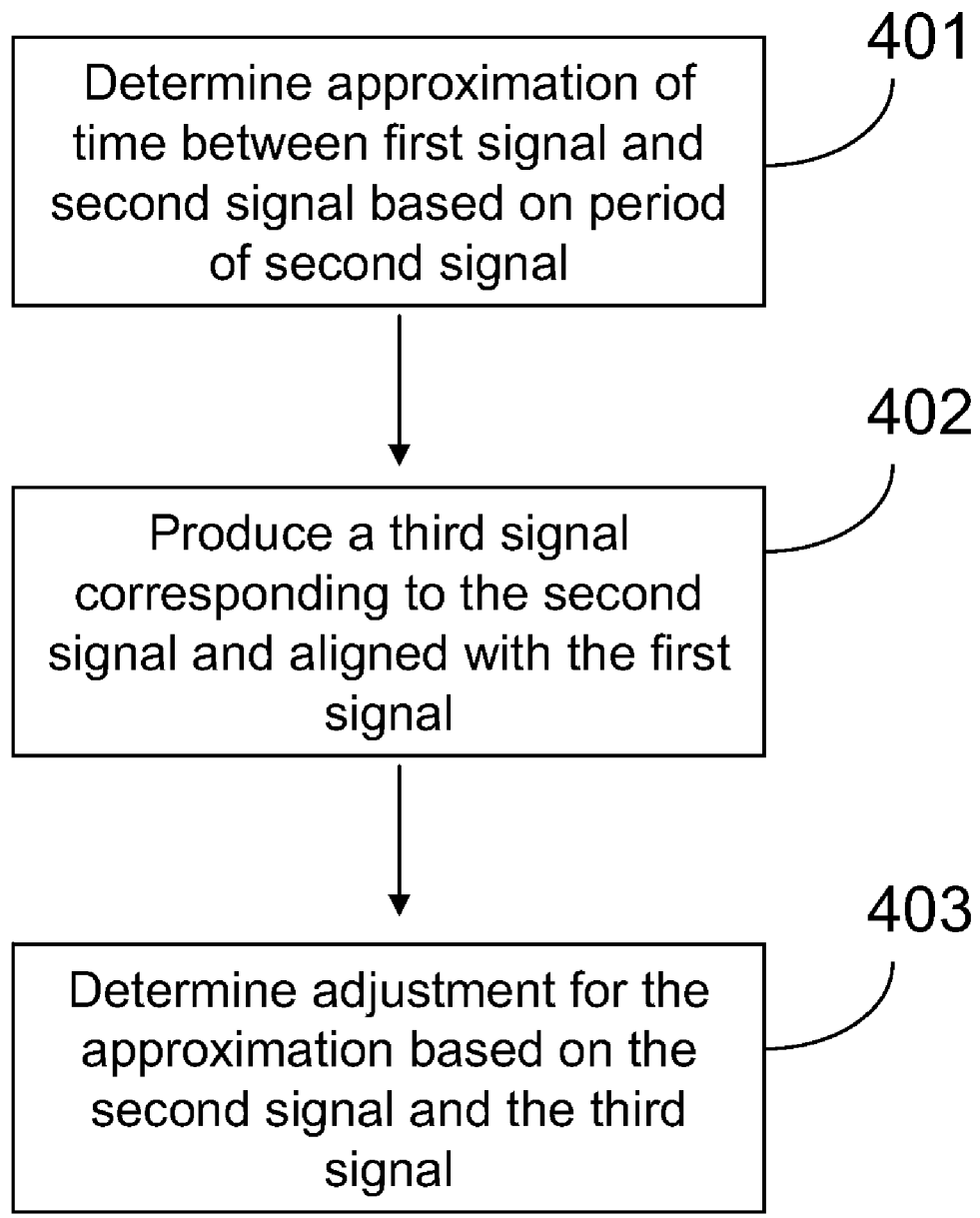
FIG. 4 is a flowchart of a method for detecting a time between a first signal and a second signal, according to one embodiment of the present invention.

According to one embodiment, the timing is approximated using the period of the clock signal (see, for example, step 401 of FIG. 4). A third signal is produced to correspond to the clock signal and to have an edge transition aligned with that of the input signal (see, for example, step 402 of FIG. 4). An adjustment to the approximated time is determined based on the clock signal and the third signal. The timing that is ultimately determined has a resolution finer than the period of any of the system clocks. Other embodiments may be used for measuring or determining time intervals between signals for purposes (or in environments or contexts) other than testing, including, but not limited to general measurement of signals, such as for time domain reflectometry (TDR).

Figure 1:
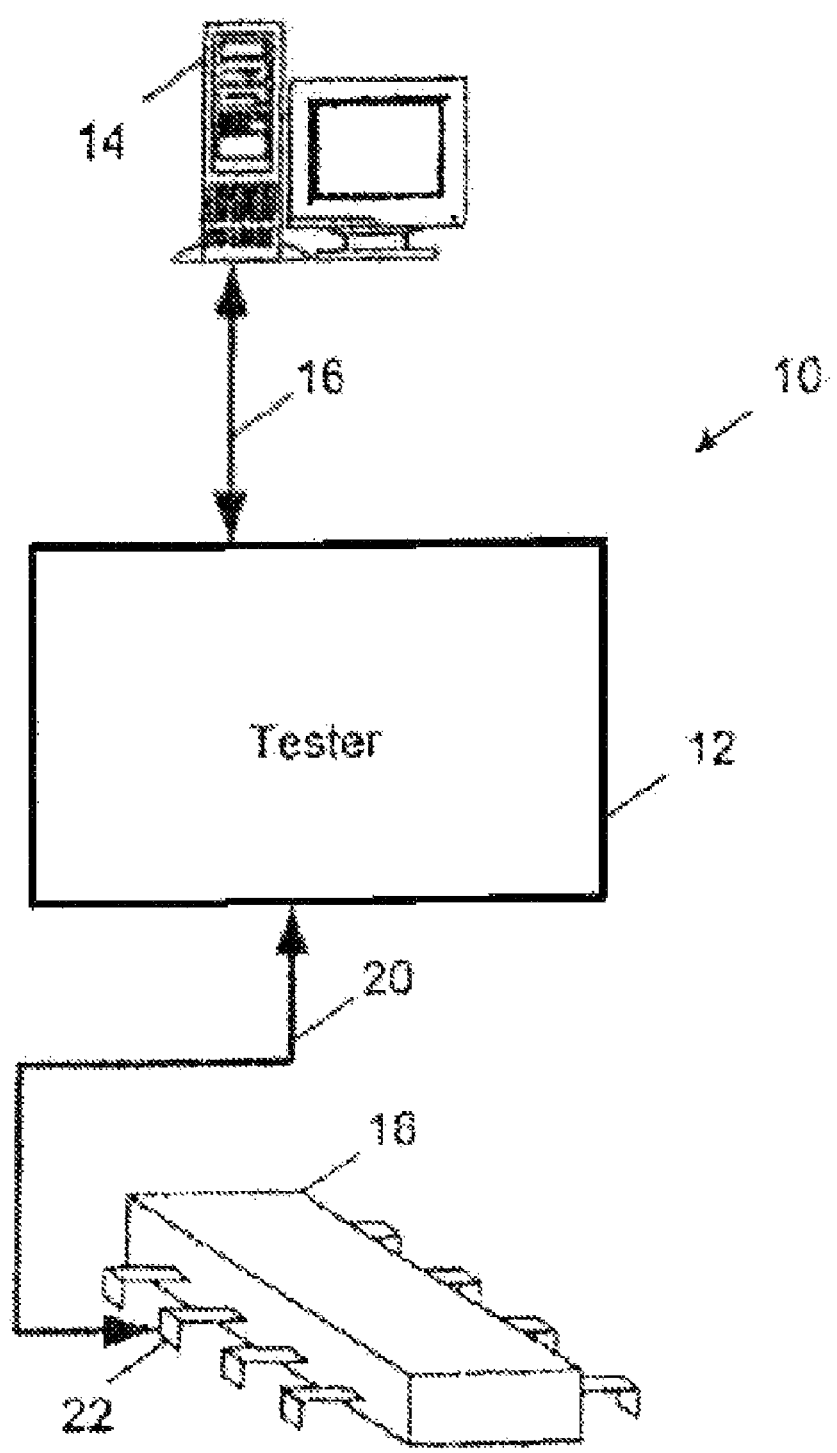
FIG. 1 is a block diagram of automatic test equipment (ATE) for testing devices.

With reference to FIG. 1, a system 10 for testing a device under test (DUT) 18 (including, but not limited to, a semiconductor device, an electronic circuit, a circuit board assembly, and the like) is shown. Examples of semiconductor devices to be tested by the system 10 include: an integrated circuit (IC) chip, a memory chip, a microprocessor, an analog-to-digital converter, a digital-to-analog converter, and the like.

The system 10 includes a tester 12 (including, but not limited to, automatic test equipment (ATE) or a similar testing device) and a computer system 14 for controlling the tester 12. The computer system 14 interfaces with the tester 12 over a connection 16 (including, but not limited to, a hardwire connection). In one embodiment, the computer system 14 sends commands to the tester 12 in order to initiate an execution of routines and functions for testing the DUT 18. Such executing test routines may, as described in further detail below, initiate the generation and transmission of test signals to the DUT 18 and the collection of responses from the DUT 18.

With continued reference to FIG. 1, to provide test signals and collect responses from the DUT 18, the tester 12 is connected to one or more connector pins (e.g., connector pin 22) of the DUT 18. These connector pins provide an external interface coupled to internal circuitry of the DUT 18. In some instances, 128 (or more) connector pins may be connected to the tester 12. As shown for illustrative purposes in the embodiment of FIG. 1, the tester 12 is connected to connector pin 22 of the DUT 18 via a hardwire connection. As shown in FIG. 1, a conductor 20 (including, but not limited to, an electric cable or wire) is used to connect the tester 12 and the connector pin 22. Test signals are delivered from the tester 12 to the internal circuitry of the DUT 18 via the conductor 20.

The conductor 20 also senses signals at the pin 22 provided in response to the test signals delivered from the tester 12. For example, the DUT 18 may provide a voltage (or current) signal in response to a test signal delivered via the conductor 20. The voltage signal may be sensed at the pin 22 and delivered over the conductor 20 to the tester 12 for analysis.

Figure 2:
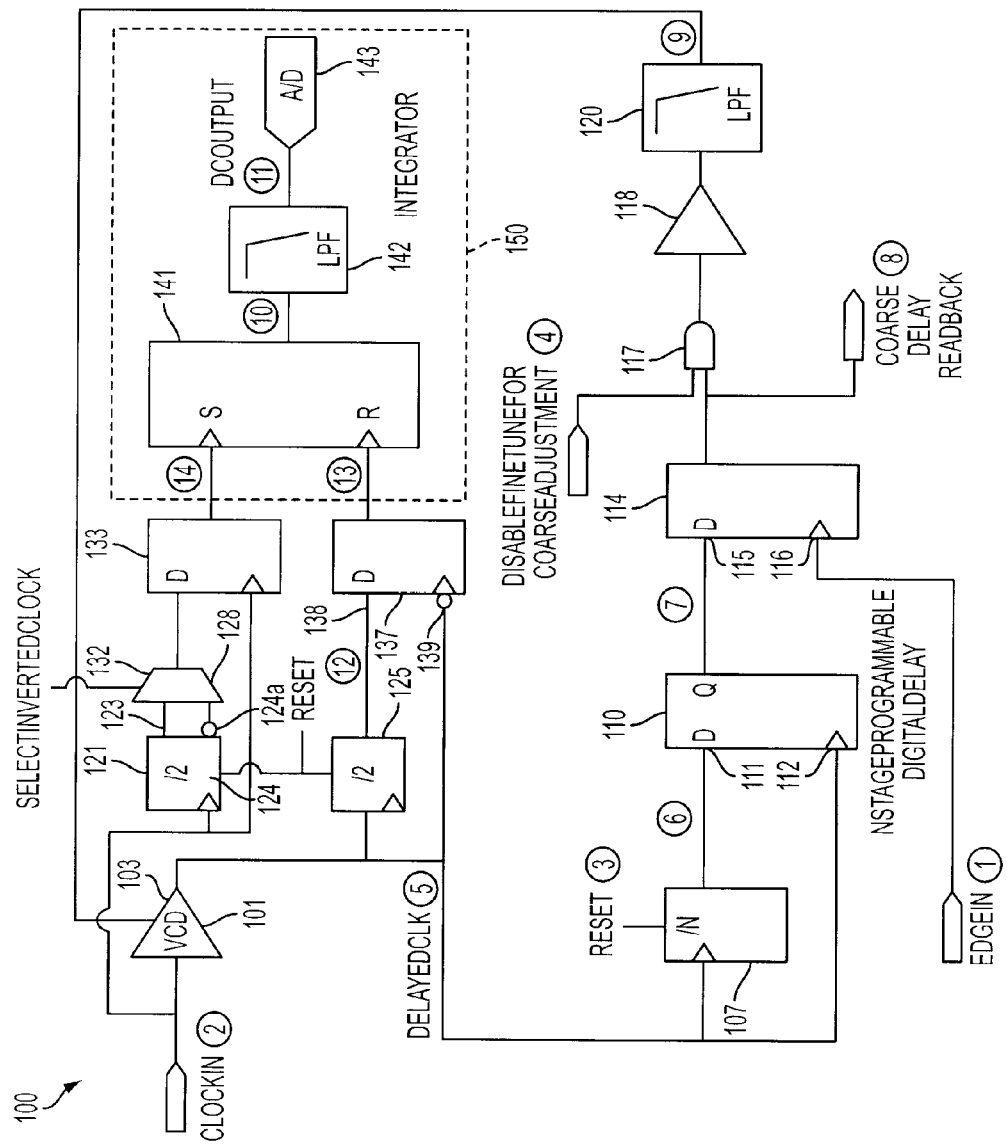
FIG. 2 is a circuit diagram of a time measurement device, in one embodiment of the present invention, which may be used with the ATE.

FIG. 2 shows a circuit diagram of a time measurement system 100 according to an embodiment of the present invention. The time measurement system 100 may be used with and may be part of the tester 12 described above.

With reference to FIG. 2, the system 100 includes a voltage-controlled delay (VCD) 101 for producing a delayed (i.e. time-shifted) signal corresponding to the input signal. The amount of delay (or shift) that is present in the delayed output is based on a control signal (including, but not limited to, a control voltage) that is input to port 103 of the VCD 101. For example, when a periodic signal is input to the VCD 101, the amount of delay in the output may range from 0 seconds (i.e., no delay) to the length of the period of the input periodic signal (i.e., effectively no delay). However, the VCD 101 may also shift the input signal by a delay exceeding the period of the input signal. In one embodiment, the VCD 101 is composed of a series of CMOS buffers coupled in series.

A programmable frequency divider 107 is coupled to the output of the VCD 101. The divider 107 receives an input signal and produces a output signal corresponding to the input signal but having a frequency that is lower than that of the input signal. In more detail, the frequency of the output is 1/N times the frequency of the input. For example, if N is set to 2, the frequency of the signal output by the divider 107 is one half of the frequency of the input signal. Similarly, if N is set to 4, the frequency of the output signal is one fourth of the frequency of the input signal.

Both the output of the frequency divider 107 and the output of the VCD 101 are coupled to programmable digital delay 110. The digital delay 110 delays (or time-shifts) the input signal received at input port 111 by an amount equal to an integer multiple of periods of the input signal received at input port 112.

The output of the digital delay 110 is coupled to D flip-flop 114. As is known in the art, the D flip-flop 114 "captures" the state of the signal input to port 115 upon the occurrence of a rising edge of a signal input to port 116. This state is produced as the output of the D flip-flop 114. The output of the D flip-flop 114 remains unchanged at any other time.

The output of the D flip-flop 114 (which may be referred to hereinafter as the coarse delay readback signal, or coarse delay readback) is coupled to selector 117 for enabling and disabling of fine tuning, as will be described in more detail below. In one embodiment, as shown in FIG. 2, the selector 117 is composed of an AND logic gate. In one embodiment, the selector 117 is coupled to low pass filter (LPF) 120 via buffer 118. The LPF 120 translates the transitioning digital output of the coarse delay readback signal into an analog fine delay control signal. The output of the LPF 120 is coupled with port 103 of VCD 101.

With continued reference to FIG. 2, the input signal to the VCD 101 (i.e., the signal that is delayed according to the control signal input to port 103 of VCD 101) is also input to frequency divider 121. The divider 121 operates similarly to frequency divider 107, which was described earlier. As shown in FIG. 2, in one embodiment, the divider 121 is configured to produce at output port 123 a signal having a frequency that is one half of the frequency of the input signal. The same output signal is produced at output port 124. An inverter 124a produces an inverted signal corresponding to the signal at output port 124.

The outputs of the frequency divider 121 and the inverter 124a are coupled with a selector 128. Based on a signal input to a control port 132 of the selector circuit 128, one of the respective outputs of output port 123 of the frequency divider 121 and the inverter 124a is selected as an output of the selector 128. The output of the selector 128 is coupled with D flip-flop 133.

The output of the VCD 101 is coupled with frequency divider 125. The frequency divider 125 operates similarly to divider 121. Similar to divider 121, as shown in FIG. 2, in one embodiment, the divider 125 is configured to produce a signal having a frequency that is one half of the frequency of the input signal.

The output of the divider 125 is coupled with negative edge triggered D flip-flop 137. As is known in the art, the negative edge triggered D flip-flop 137 "captures" the state of the signal input to port 138 upon the occurrence of a falling edge of a signal input to port 139. This state is produced as the output of the D flip-flop 137. The output of the D flip-flop 137 remains unchanged at any other time.

The outputs of the D flip-flops 133, 137 are respectively coupled with S (set) and R (reset) inputs of S-R latch 141. As is known in the art, states of the S-R latch 141 are as follows: setting the R input high while the S input is low sets the output of the S-R latch 141 to be low. Setting the S input high while the R input is low sets the output of the S-R latch 141 to be high.

The output of the S-R latch 141 is coupled to a low pass filter 142. The low pass filter 142 is coupled with an A/D converter 143. In one embodiment, the A/D converter is composed of a digital voltmeter for converting an analog voltage output by the low pass filter 142.

Operation of the illustrative embodiment shown in FIG. 2 will now be described in more detail with reference to FIG. 2 and the timing diagrams of FIG. 3. As will be described in more detail below, the operation generally includes two stages. First, a signal (such as, but not limited to, a clock signal) is aligned with a lower-frequency signal having an edge to be measured, such that both signals are positioned to fall within a period of the higher-frequency clock signal. Next, the signals are further aligned such that respective edges of the signals are aligned with one another. Here, the amount of the further alignment will be used to determine the timing of the edge to be measured with respect to a reference time (or reset time). That is, a reference time is selected, e.g., with respect to one of the signals, and the timing of the edge transition of the other signal is measured with reference to the reference time.

Figure 3A:
FIG. 3(a) is a timing diagram of an input clock signal in one embodiment of the present invention.
Figure 3B:
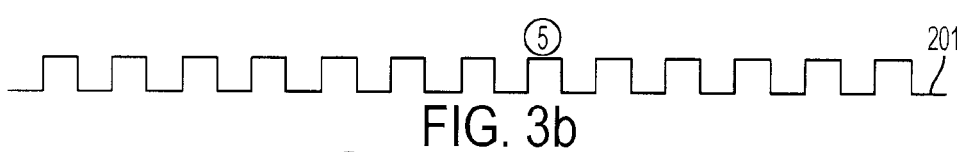
FIG. 3(b) is a timing diagram of a delayed signal of the signal of FIG. 3(a), with fine delay disabled.
Figure 3C:
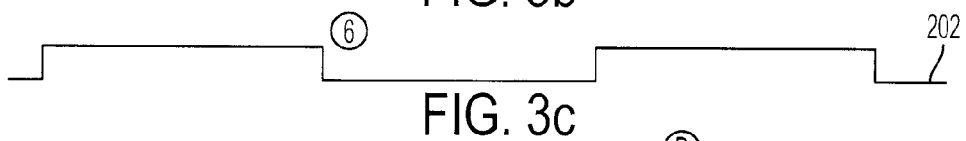
FIG. 3(c) is a timing diagram of a divided signal of the signal of FIG. 3(b).
Figure 3D:
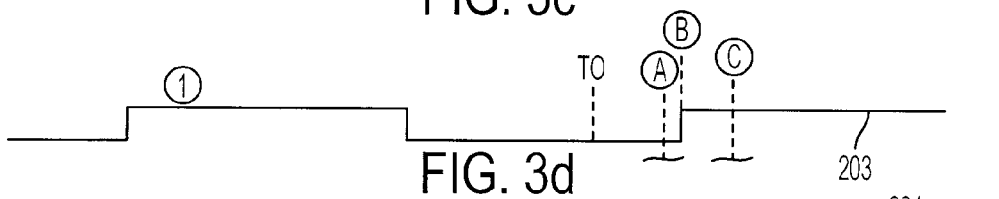
FIG. 3(d) is a timing diagram of an input signal in one embodiment of the present invention.

According to one embodiment, as shown in FIG. 3(d), the signal having the edge to be measured is a periodic signal 203. For purposes of illustration, the reference time is annotated as time T0, and the edge to be measured is annotated as occurring at time B. As such, the interval of interest that is to be measured is the time between reference time T0 and the time B of the rising edge of signal 203. The signal 203 is input to port 116 of D flip-flop 114.

As shown in FIG. 3(a), a periodic signal 200 is supplied. The signal 200 has a frequency higher than the frequency of the signal 203. In one embodiment, the frequency of the signal 200 is an integer multiple of the frequency of the signal 203. In one embodiment, the signal 200 is a clock signal. Hereinafter, the signal 200 and signals derived therefrom will be referred to as clock signals. However, embodiments of the invention are not limited thereto. As shown in FIGS. 3(d) and 3(a), a rising edge of signal 200 is aligned with reference time T0.

The VCD 101 delays the clock signal 200 according to the control signal input to port 103 of VCD 101. Here, the selector 117 is controlled to effectively disable the output of the D flip-flop 114. (In one embodiment, the output is disabled by inputting a logic-low signal to the AND gate of the selector 117. Enabling of this output will be described in more detail below.) As such, the output clock signal 201 (see FIG. 3(b)) produced by the VCD 101 does not include any delay. That is, at this initial stage, the control signal input to port 103 of VCD 101 is held at a nominal level, resulting in a constant minimal or maximal delay.

An alignment of the two signals 201, 203 is then performed. First, the clock signal 201 is "divided down" to the frequency of the signal 203 by divider 107. In other words, in producing clock signal 202 (see FIG. 3(c)), the divider 107 creates a signal having a frequency equal to the frequency of the clock signal 201 as reduced by a factor of N, where N is an integer. As such, the frequency of the clock signal 202 is set equal to the frequency of the signal 203. (As shown in FIG. 2, a reset signal that establishes the reference time T0 may also be input to divider 107 and other dividers in the system 100 for synchronizing the dividers in the system 100 with one another such that a repeatable phase relationship is maintained.) According to another embodiment, the frequency of the clock signal 202 is set approximately equal to the frequency of the signal 203.

As shown for illustrative purposes in FIGS. 3(b), 3(c) and 3(d), because the frequency of clock signal 200 is 8 times the frequency of signal 203, the clock divider 107 divides the frequency of the clock signal 201 by N=8 to produce the clock signal 202.

The clock signal 202 is then digitally (or stepwise) delayed until respective edge transitions of the clock signal 202 and the signal 203 are aligned with each other such that the transitions fall within a period of clock signal 201. This is accomplished by programmable digital delay 110. The delay 110 is programmed to delay the clock signal 202 by integer multiples of the period of clock signal 201 such that the rising edge of the output of the delay 110 is optimally close to the rising edge B of signal 203. The delayed clock (i.e., the output of the delay circuit 110) is compared to the lower-frequency input signal 203 in the D flip-flop 114. The state of the coarse delay readback signal (i.e., the output of the D flip-flop 114) is observed.

The delay 110 is programmed with successive integer values (e.g., to delay the input clock 202 by increasing consecutive integer multiples of the period of clock signal 201) until a transition at the output of D flip-flop 114 is observed.

Figure 3E:
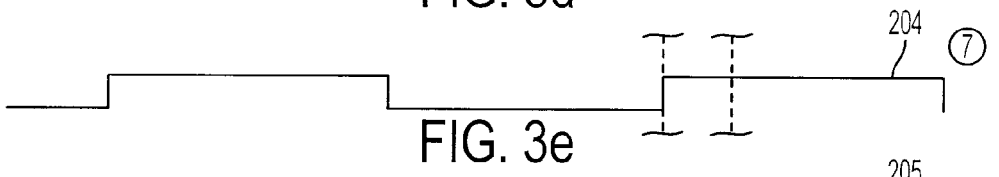
FIG. 3(e) is a timing diagram of the signal of FIG. 3(c), as delayed by one period of the clock signal of FIG. 3(b).
Figure 3F:
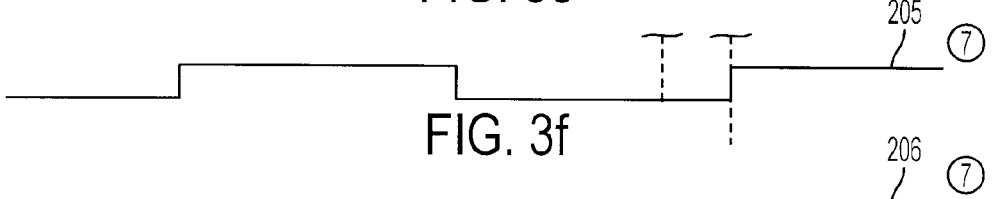
FIG. 3(f) is a timing diagram of the signal of FIG. 3(c), as delayed by two periods of the clock signal of FIG. 3(b).
Figure 3G:
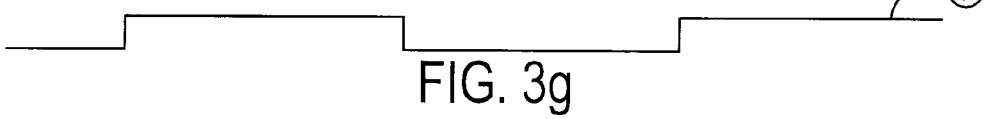
FIG. 3(g) is a timing diagram of a delayed signal of FIG. 3(e) (of FIG. 3(f)), with fine delay enabled.
Figure 3H:
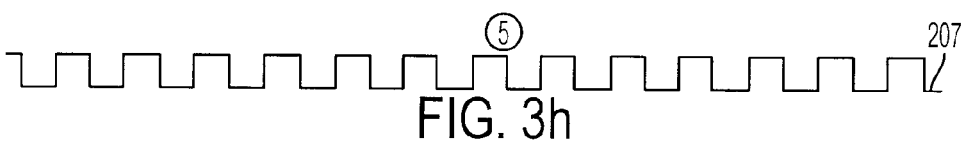
FIG. 3(h) is a timing diagram of a delayed signal of FIG. 3(b), with fine delay enabled.
Figure 3I:
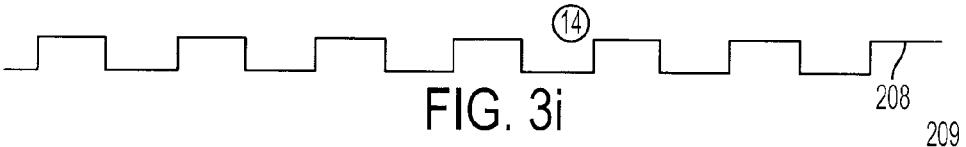
FIG. 3(i) is a timing diagram of a divided signal of the signal of FIG. 3(a).
Figure 3J:
FIG. 3(j) is a timing diagram of a divided signal of the signal of FIG. 3(h).
Figure 3K:
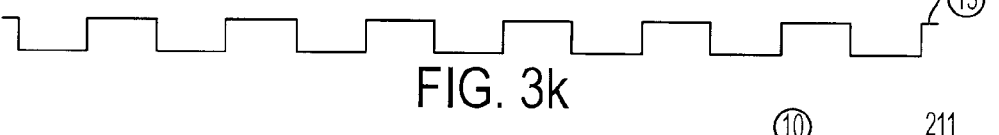
FIG. 3(k) is a timing diagram of the signal of FIG. 3(j), as delayed by one-half period of the clock signal of FIG. 3(b).
Figure 3L:
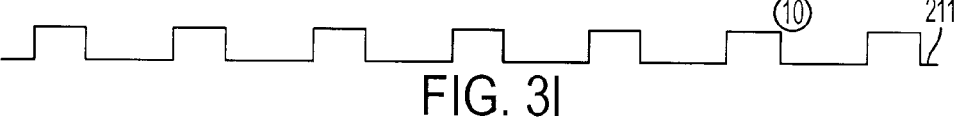
FIG. 3(l) is a timing diagram of an output of an integrator of FIG. 2.

For example, as shown in FIG. 3(e), the delay 110 produces clock signal 204 by delaying clock signal 202 by one period of clock signal 201. Here, at the time of rising edge A of clock 204, the rising edge B of signal 203 has not yet occurred (i.e., the rising edge B has not yet been detected or observed). As such, the digital delay 110 is programmed to delay clock signal 202 by two periods of clock signal 201, to produce clock signal 205. By the time of rising edge C of clock signal 205, the rising edge B of signal 203 has occurred (i.e., the rising edge B has been detected or observed). The value programmed in the delay 110 when a transition is observed is a coarse measurement (as measured in periods of the clock 201) between the reference time T0 and the edge transition of the signal 203.

Once the coarse measurement, as described above, is performed, a measurement having a finer resolution is made. Here, the selector 117 is controlled to enable the output of the D flip-flop 114. (In one embodiment, the output is enabled by inputting a logic-high signal to the AND gate of the selector 117.)

As will be described in more detail below, the VCD 101 will be controlled to further adjust the delay of the clock signal (e.g., signal 204 or signal 205) by finer steps so that its rising edge is coincident with the rising edge of input signal 203. These adjustments will be made in one or more stepwise increments that are smaller than the period of clock signal 201. For example, if the input edge B occurs after the rising edge of the clock signal (e.g., see FIGS. 3(d) and 3(e)), the clock delay will be increased by these stepwise increments. Similarly, if the input edge B occurs before the rising edge of the clock signal (e.g., see FIGS. 3(f) and 3(d)), the clock delay will be decreased. For either situation, the coarse measurement, as described above, will be adjusted accordingly.

Here, the output of the D flip-flop 114 is coupled with low pass filter (LPF) 120. In one embodiment, as shown in FIG. 2, the output of the D flip-flop 114 is coupled with LPF 120 via a buffer 118. The output of LPF 120 is coupled with port 103 of VCD 101. As such, a feedback loop is created to align the rising edge of the delayed clock signal with the rising edge of input signal 203. The LPF 120 translates the transitioning digital output of the coarse delay readback into an analog fine delay control signal. When the input edge B and the rising edge of the delayed clock output of VCD 101 (which, as described earlier, is provided to the divider 107 and the digital delay 110) are coincident with each other, the coarse delay readback signal will toggle with a duty cycle that is stable. Here, the signal, as processed by LPF 120, will also be stable. The time constant of the low pass filter 120 should be suitably long to stabilize the circuit.

As described above, when the output of LPF 120 is stable, the respective edges of the clock signal and the input signal 203 are aligned with each other. In addition, the output of LPF 120 is proportional to the sum of the finer delay steps described previously.

The VCD 101 delays the clock signal 200 by a delay according to the output of the LPF 120. Here, the VCD 101 produces the clock signal 207, as shown in FIG. 3(*h*). As shown in FIG. 3(*h*), a rising edge of clock signal 207 is aligned with rising edge B of signal 203. As shown in FIGS. 3(*h*) and 3(*a*), the frequency of the clock signal 207 is equal (or substantially equal) to that of the clock signal 200. As such, a clock signal having a frequency higher than that of input signal 203 and having an edge transition aligned with rising edge B of signal 203 is produced. This signal (i.e., clock signal 207) and clock signal 200 are then processed such that a time measurement between the two signals may be determined by integrator 150.

Because the integrator 150 covers a span of over one clock period (i.e., of clocks 200, 201), each of the clock signals 200 and 207 is further processed. Here, each of the clock signals 200 and 207 is divided down by a factor of two. As such, clock signal 200 is input to divider 121, and clock signal 207 is input to divider 125. As shown in FIG. 3(*i*), clock signal 208 is produced by divider 121. As shown in FIG. 3(*j*), clock signal 209 is produced by divider 125.

In embodiments of the invention, implementation of a further delay between clock signals 200, 207 may help to ensure that the clocks are optimally out of phase such that the integrator 150 is kept in its linear region. Here, a timing separation (e.g., of one half or three halves of the clock period (e.g., of clock signals 200, 207)) is implemented between the clocks 200, 207. In embodiments of the invention, this timing separation is implemented with a negative-edge-triggered D flip-flop (e.g., see D flip-flop 137 in FIG. 2) and/or a D flip-flop into which an input data signal may be selected from a signal and its inverse (e.g., see selector 128 and D flip-flop 133 in FIG. 2). As shown in FIGS. 3(*j*) and 3(*k*), in one embodiment, the clock signal 209 is further delayed by one half of the clock period (e.g., of clock signals 200, 207) in D flip-flop 137 (see clock signal 210 of FIG. 3(*k*)).

The respective outputs of the D flip-flops 133, 137 are input to integrator 150. In one embodiment, the integrator 150 includes S-R latch 141 and a low pass filter (LPF) 142. The outputs of the D flip-flops 133 and 137 are input to the S and R inputs of the S-R latch 141, respectively. The edge-triggered S/R latch 141 translates the timing difference between the outputs of the flip-flops 133, 137 into digital signal 211 (see FIG. 3(*l*)). Digital signal 211 is then filtered by LPF 142.

The duty cycle of the signal 211 depends on the timing relationship between the two clock signals 208, 210 and will have an optimal range of 25% to 75%. The LPF 142 of the integrator 150 translates the duty cycle of the signal 211, as produced by the S-R latch 141, to a DC voltage that can be measured by voltmeter 143. Here, it will be appreciated by those skilled in the art that the time constant of the LPF 142 should be chosen so that it is much slower than the clock frequency. Longer time constants will increase measurement time.

The output of the integrator 150, together with the value of the coarse measurement described previously, indicate the position of the input edge B with a resolution as determined by the integrator 150. The range is an entire input edge period.

The integrator 150 should be calibrated prior to use. This calibration may involve measuring the DC level resulting from a low frequency edge at a selected point in time and the DC level resulting from an edge delayed from the selected point in time precisely by one clock period.

As can be seen from the above description, critical timing in the system 100 is moved to the S/R latch 142 in the integrator 150. As such, those skilled in the art will appreciate that the latch 142 should have rise/fall times that assure that good logic levels will be achieved for all possible (or meaningful) edge relationships.

The system and method described above allows lower-frequency periodic signals to be measured in terms of a number of periods of a higher-frequency clock and a finer resolution measurement. The finer resolution measurement requires a range that spans only a single period of the higher-frequency clock signal rather than an entire period of the lower-frequency signal, which increases the measurement capabilities of the analog measurement device. As such, in situations where a phase relationship between a lower-frequency signal and a clock signal is to be determined, the phase relationship can be more easily and accurately determined by using the lower-frequency signal to create a higher-frequency signal. The phase relationship between the higher-frequency signal and the clock signal is equal to that between the lower-frequency signal and the clock signal.

It should be understood that various modifications may be made to the embodiments disclosed herein. Therefore, the above description should not be construed as limiting, but merely as exemplification of the various embodiments. For example, other embodiments may be used for measuring or determining time intervals between signals for purposes (or in environments or contexts) other than testing, including, but not limited to general measurement of signals, such as for time domain reflectometry (TDR). Those skilled in the art will envision other modifications within the scope and spirit of the claims appended thereto.

What is claimed is:

1. A system for detecting a time between first periodic transitions in a first periodic signal and corresponding respective second periodic transitions in a second periodic signal, the second periodic signal having a frequency higher than a frequency of the first signal, the system comprising:

an electronic circuit for determining an approximation of the time based on a period of the second signal and for determining an adjustment to the approximation based on the second signal and a third signal corresponding to the second signal and aligned with the first signal; and a voltage-controlled delay circuit configured to receive the second signal and to delay the second signal to produce the third signal, wherein the voltage-controlled delay circuit is configured to delay the second signal according to a control signal produced by a feedback loop circuit for receiving the third signal from the voltage-controlled delay circuit, wherein the length of the adjustment is less than the period of the second signal.

2. The system of claim 1, wherein the electronic circuit comprises an integrator configured to measure a time separation between the second signal and the third signal.

3. The system of claim 2, wherein the integrator comprises an S-R latch.

4. The system of claim 2, wherein the electronic circuit further comprises one or more delay circuits coupled with the integrator for operating the integrator in a linear region.

5. The system of claim 1, wherein the third signal has a frequency equal to the frequency of the second signal.

6. The system of claim 1, wherein the feedback loop circuit comprises a frequency divider coupled with a programmable delay circuit.

7. The system of claim 1, wherein the feedback loop circuit comprises a low pass filter coupled with an input of the voltage-controlled delay circuit.

8. The system of claim 1, wherein the feedback loop circuit is controllable to disable and to enable providing of the control signal to the voltage-controlled delay element.

9. A method for detecting a time between first periodic transitions in a first periodic signal and corresponding respective second periodic transitions in a second periodic signal, the second periodic signal having a frequency higher than a frequency of the first signal, the method comprising:
   determining an approximation of the time based on a period of the second signal; and
   determining an adjustment for the approximation based on the second signal and a third signal corresponding to the second signal and aligned with the first signal, wherein:
   the length of the adjustment is less than the period of the second signal; and
   determining the adjustment comprises determining a time difference between the second signal and the third signal.

10. The method of claim 9, wherein the third signal has a frequency equal to the frequency of the second signal.

11. The method of claim 9, wherein determining the time difference between the second signal and the third signal comprises supplying the second signal and the third signal to an integrator.

12. The method of claim 9, wherein determining the adjustment comprises delaying the second signal according to a control signal to produce the third signal.

13. The method of claim 12, further comprising controlling a feedback loop circuit to receive the third signal and to produce the control signal.

14. The method of claim 13, wherein controlling the feedback loop circuit comprises controlling the feedback loop circuit to produce a fourth signal corresponding to the second signal and having a frequency equal to the frequency of the first signal.

15. The method of claim 13, wherein the feedback loop is configurable to enable and to disable producing of the control signal.

16. A method of operating circuitry for detecting a time between first periodic transitions in a first periodic signal and corresponding respective second periodic transitions in a second periodic signal, the first periodic signal having a first frequency and the second periodic signal having a second frequency higher than the first frequency, the method comprising:
   during a first interval, adjusting a coarse amount of delay of a signal derived from the second signal, the derived signal having the first frequency and transitions corresponding to the second periodic transitions, and the coarse amount of delay being adjusted such that each first periodic transition and a transition corresponding to a respective second periodic transition occur during a single period of the second periodic signal;
   during a second interval:
      generating a control signal representative of a difference in time between each first periodic transition and the transition corresponding to the respective second periodic transition; and
      adjusting a fine amount of delay of the signal derived from the second signal based on the control signal; and
   determining the time by combining the coarse amount of delay and the fine amount of delay.

17. The method of claim 16, wherein:
adjusting the coarse amount of delay comprises increasing the coarse amount of delay in increments of a period of the second periodic signal until a flip-flop, clocked by the first signal and having the derived signal as an input, produces an output.

18. The method of claim 17, wherein:
adjusting the fine amount of delay of the signal derived from the second signal comprises applying a control voltage to a voltage controlled delay, the control voltage being generated from the output of the flip-flop, the voltage controlled delay providing a variable delay up to an amount equal to a period of the second signal.

19. The method of claim 18, wherein:
the control voltage is generated in a filter coupled to the output of the flip-flop; and
the method further comprises operating a selector to selectively pass the output of the flip-flop to the filter during the second interval.

20. The method of claim 19, wherein:
the signal derived from the second signal is derived by passing the second signal through the voltage controlled delay to produce a delayed second signal and dividing a frequency of the delayed second signal by a ratio between the second frequency and the first frequency;
measuring the fine delay comprising generating a signal representative of a time difference between the second periodic transitions of the second signal and respective periodic transitions of the delayed second signal.

* * * * *